(12) United States Patent
Sakaida et al.

(10) Patent No.: US 11,459,486 B2
(45) Date of Patent: Oct. 4, 2022

(54) POLISHING COMPOSITION CONTAINING AMPHOTERIC SURFACTANT

(71) Applicant: NISSAN CHEMICAL CORPORATION, Tokyo (JP)

(72) Inventors: Hiroaki Sakaida, Funabashi (JP); Eiichiro Ishimizu, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 16/605,950

(22) PCT Filed: Apr. 10, 2018

(86) PCT No.: PCT/JP2018/015089
§ 371 (c)(1),
(2) Date: Oct. 17, 2019

(87) PCT Pub. No.: WO2018/193916
PCT Pub. Date: Oct. 25, 2018

(65) Prior Publication Data
US 2020/0123414 A1    Apr. 23, 2020

(30) Foreign Application Priority Data
Apr. 17, 2017   (JP) .............................. JP2017-081531

(51) Int. Cl.
| | | |
|---|---|---|
| *C09G 1/02* | (2006.01) | |
| *C08K 3/22* | (2006.01) | |
| *C08K 3/26* | (2006.01) | |
| *C08K 3/36* | (2006.01) | |
| *C08K 5/17* | (2006.01) | |
| *C08K 5/19* | (2006.01) | |
| *C08K 5/42* | (2006.01) | |
| *C09G 1/04* | (2006.01) | |
| *C09K 3/14* | (2006.01) | |
| *H01L 21/304* | (2006.01) | |
| *H01L 21/321* | (2006.01) | |

(52) U.S. Cl.
CPC .................. *C09G 1/02* (2013.01); *C08K 3/22* (2013.01); *C08K 3/26* (2013.01); *C08K 3/36* (2013.01); *C08K 5/175* (2013.01); *C08K 5/19* (2013.01); *C08K 5/42* (2013.01); *C09G 1/04* (2013.01); *C09K 3/1409* (2013.01); *H01L 21/304* (2013.01); *H01L 21/3212* (2013.01); *C08K 2003/2203* (2013.01); *C08K 2003/262* (2013.01); *C08K 2201/003* (2013.01)

(58) Field of Classification Search
CPC ...... C08K 2003/2203; C08K 2003/262; C08K 2201/003; C08K 3/22; C08K 3/26; C08K 3/36; C08K 5/175; C08K 5/19; C08K 5/42; C09G 1/02; C09G 1/04; C09K 3/14; C09K 3/1409; C09K 3/1463; H01L 21/304; H01L 21/3212; B24B 37/00; B24B 37/044

USPC .... 252/79.1, 79.2, 79.3, 79.4; 438/691, 692, 438/693, 79.1, 79.2, 79.3, 79.4
See application file for complete search history.

(56) References Cited

U.S. PATENT DOCUMENTS

| | | | | |
|---|---|---|---|---|
| 6,776,696 | B2 * | 8/2004 | Mahulikar | ............ B24B 37/044 |
| | | | | 257/E21.304 |
| 2001/0005009 | A1 * | 6/2001 | Tsuchiya | .................. C09G 1/02 |
| | | | | 252/79 |
| 2009/0104778 | A1 * | 4/2009 | Sakanishi | ............ C09K 3/1463 |
| | | | | 438/692 |
| 2010/0001229 | A1 * | 1/2010 | Nakagawa | ................ C09G 1/02 |
| | | | | 252/79.1 |

(Continued)

FOREIGN PATENT DOCUMENTS

| | | |
|---|---|---|
| JP | 2004-204098 A | 7/2004 |
| JP | 2004-247542 A | 9/2004 |

(Continued)

OTHER PUBLICATIONS

Jun. 19, 2018 International Search Report issued in International Patent Application No. PCT/JP2018/015089.
Jun. 19, 2018 Written Opinion of the International Searching Authority issued in International Patent Application No. PCT/JP2018/015089.
Nov. 23, 2020 Extended European Search Report issued in European Patent Application No. 18787987.9.

*Primary Examiner* — Lan Vinh
(74) *Attorney, Agent, or Firm* — Oliff PLC

(57) ABSTRACT

There are provided a polishing composition that gives, in the step of polishing a wafer, a flat polished surface having a reduced height difference between a central region and a peripheral region (laser mark region) of the wafer, and a method for producing a wafer using the polished composition. A polishing composition comprising water, silica particles, an alkaline substance, and an amphoteric surfactant of formula (1):

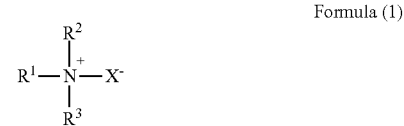

Formula (1)

wherein $R^1$ is a $C_{10\text{-}20}$ alkyl group, or a $C_{1\text{-}5}$ alkyl group containing an amide group; $R^2$ and $R^3$ are each independently a $C_{1\text{-}9}$ alkyl group; and $X^-$ is a $C_{1\text{-}5}$ anionic organic group containing a carboxylate ion or a sulfonate ion. Silica particles in the form of an aqueous dispersion of silica particles having a mean primary particle diameter of 5 to 100 nm may be used. A method for producing a wafer, wherein in the step of polishing a wafer, polishing is performed until a height difference between a central region and a peripheral region of the wafer becomes 100 nm or less.

14 Claims, No Drawings

(56) References Cited

U.S. PATENT DOCUMENTS

| | | | |
|---|---|---|---|
| 2010/0301014 A1 | 12/2010 | Mizuno et al. | |
| 2012/0252214 A1* | 10/2012 | Kamimura | C09K 3/1463 438/693 |
| 2012/0270400 A1* | 10/2012 | Takegoshi | H01L 21/76224 438/692 |
| 2018/0244532 A1* | 8/2018 | Killeen | C09G 1/02 |

FOREIGN PATENT DOCUMENTS

| | | |
|---|---|---|
| JP | 2009-187986 A | 8/2009 |
| JP | 2013-251561 A | 12/2013 |
| JP | 2016-194006 A | 11/2016 |
| JP | 2017-190363 A | 10/2017 |
| KR | 2012-0071716 A | 7/2012 |
| WO | 2010/012159 A1 | 2/2010 |
| WO | 2016/132951 A1 | 8/2016 |

* cited by examiner

POLISHING COMPOSITION CONTAINING AMPHOTERIC SURFACTANT

TECHNICAL FIELD

The present invention relates to a polishing composition used for polishing a wafer surface, and particularly relates to a polishing composition for achieving, in the step of polishing a wafer, a flat polished surface that does not have a height difference between a central region and a peripheral region (also referred to as a laser mark region, for example) of the wafer.

BACKGROUND ART

In general, a method for producing a substrate wafer in the electronic industry includes 1) a slicing step of slicing a single-crystal ingot to obtain a thin disc-shaped wafer; 2) a chamfering step of chamfering an outer peripheral region of the wafer; 3) a lapping step of planarizing the chamfered wafer; 4) an etching step of removing a processing distortion in the lapped wafer; 5) a polishing step of mirror-finishing the surface of the etched wafer; and 6) a cleaning step of cleaning the polished wafer.

Various additives such as PVP, quarternary ammonium salts, or surfactants have been applied to such polishing agents.

For example, polishing compositions are disclosed that contain a polymerizable resin, which is, for example, a polystyrene resin, a (meth)acrylic resin, a polyolefin resin, a polyvinyl chloride resin, a rubber-based resin, a polyester resin, a polyamide resin, or a polyacetal resin, or a thermosetting resin, such as a phenol resin, an epoxy resin, a urethane resin, a urea resin, or a melamine resin, in combination with a cationic compound, such as an amine compound, a quarternary ammonium salt, or a betaine (see Patent Documents 1 and 2).

The polishing step 5) above is performed by pressing an object to be polished, i.e., a wafer, against a polishing pad, and moving the wafer relative to the polishing pad, while supplying a polishing solution composition to a surface of the polishing pad. The polishing step is generally composed of a plurality of stages, i.e., primary polishing, secondary polishing, and final polishing. The primary polishing and the secondary polishing are performed for the purpose of removing deep damage on the wafer surface generated by the lapping or etching step.

In contrast, the final polishing is performed for the purpose of removing a minute surface defect remaining after the primary polishing and the secondary polishing to achieve planarization to a high degree of precision.

A height difference may be generated between a central region and a peripheral region (also referred to as a laser mark region) of the wafer after this final polishing step, which becomes a problem.

PRIOR ART DOCUMENTS

Patent Documents

Patent Document 1: Japanese Patent Application Publication No. 2004-204098 (JP 2004-204098 A)
Patent Document 2: Japanese Patent Application Publication No. 2004-247542 (JP 2004-247542 A)

SUMMARY OF THE INVENTION

Problem to be Solved by the Invention

The present invention provides a polishing composition that gives, in the step of polishing a wafer, a flat polished surface having a reduced height difference between a central region and a peripheral region (laser mark region) of the wafer, and a method for producing a wafer using the polished composition.

Means for Solving the Problem

A first aspect of the present invention is a polishing composition comprising water, silica particles, an alkaline substance, and an amphoteric surfactant of formula (1):

Formula (1)

(wherein $R^1$ is a $C_{10-20}$ alkyl group, or a $C_{1-5}$ alkyl group containing an amide group; $R^2$ and $R^3$ are each independently a $C_{1-9}$ alkyl group; and $X^-$ is a $C_{1-5}$ anionic organic group containing a carboxylate ion or a sulfonate ion);

a second aspect of the present invention is the polishing composition according to the first aspect, wherein the amide group is an amide group having a $C_{10-20}$ alkyl group;

a third aspect of the present invention is the polishing composition according to the first aspect, wherein the amphoteric surfactant of formula (1) is a compound wherein $R^1$ is a $C_{10-20}$ alkyl group; $X^-$ is a $C_{1-5}$ anionic organic group containing a carboxylate ion; and $R^2$ and $R^3$ are each methyl group; or a compound wherein $R^1$ is a $C_{1-5}$ alkyl group containing an amide group having a $C_{10-20}$ alkyl group; $X^-$ is a $C_{1-5}$ anionic organic group containing a sulfonate ion; and $R^2$ and $R^3$ are each methyl group;

a fourth aspect of the present invention is the polishing composition according to any one of the first to third aspects, wherein the silica particles are silica particles in a form of an aqueous dispersion of silica particles having a mean primary particle diameter of 5 to 100 nm;

a fifth aspect of the present invention is the polishing composition according to any one of the first to fourth aspects, wherein the alkaline substance is an alkali metal hydroxide, an ammonium salt, a quaternary ammonium hydroxide, an organic amine, or an alkali metal carbonate;

a sixth aspect of the present invention is the polishing composition according to any one of the first to fifth aspects, further comprising a chelating agent;

a seventh aspect of the present invention is the polishing composition according to any one of the first to sixth aspects, wherein 0.05 to 50% by mass of the silica particles, 0.01 to 30% by mass of the alkaline substance, and 1 to 10000 ppm of the amphoteric surfactant are contained, and the balance is water;

an eighth aspect of the present invention is a method for producing a wafer comprising the step of polishing a wafer using the polishing composition according to any one of the first to seventh aspects; and a ninth aspect of the present invention is the method for producing a wafer according to the eighth aspect, wherein in the step of polishing a wafer, polishing is performed until a height difference between a central region and a peripheral region of the wafer becomes 100 nm or less.

Effects of the Invention

The polishing composition of the present invention can give, in the step of polishing a wafer, a flat polished surface having a reduced height difference between a central region and a peripheral region (laser mark region) of the wafer.

Components other than the silica particles and water contained in the polishing composition play a significant part in performing polishing so that no polishing residue is generated on this laser mark region, i.e., a so-called polished edge surface. In the present invention, the foregoing problem can be solved by the combination of the alkaline substance with the amphoteric surfactant of formula (1).

The amphoteric surfactant of formula (1) has the structure of an inner salt having a cationic moiety derived from quaternary ammonium and an anionic moiety derived from an anion structure in the molecule. The foregoing problem could be solved by having an asymmetric structure in which, among the organic groups of $R^1$, $R^2$, and $R^3$ attached to the nitrogen atom that constitutes the cationic moiety, $R^1$ has a long-chain hydrocarbon structure, and $R^2$ and $R^3$ each have a short-chain hydrocarbon structure.

MODES FOR CARRYING OUT THE INVENTION

The present invention is a polishing composition comprising water, silica particles, an alkaline substance, and an amphoteric surfactant of formula (1).

In formula (1), $R^1$ is a $C_{10-20}$ alkyl group, or a $C_{1-5}$ alkyl group containing an amide group; $R^2$ and $R^3$ are each independently a $C_{1-9}$ alkyl group; and $X^-$ is a $C_{1-5}$ anionic organic group containing a carboxylate ion or a sulfonate ion. In the $C_{1-5}$ anionic organic group of $X^-$, the hydrocarbon moiety may have a substituent, such as hydroxyl group.

The amide group may be an amide group having a $C_{10-20}$ alkyl group.

Examples of the $C_{1-5}$ alkyl group include methyl group, ethyl group, n-propyl group, i-propyl group, cyclopropyl group, n-butyl group, i-butyl group, s-butyl group, t-butyl group, n-pentyl group, and 1-methyl-n-butyl group.

Examples of the $C_{1-9}$ alkyl group include methyl group, ethyl group, n-propyl group, i-propyl group, cyclopropyl group, n-butyl group, i-butyl group, s-butyl group, t-butyl group, n-pentyl group, 1-methyl-n-butyl group, and octyl group.

Examples of the $C_{10-20}$ alkyl group include $C_{11}$ undecyl group, $C_{12}$ lauryl group, $C_{13}$ tridecyl group, $C_{14}$ myristyl group, $C_{15}$ farnesene groups, $C_{16}$ palmityl group, $C_{17}$ margaryl group, and $C_{18}$ stearyl group.

As the amphoteric surfactant of formula (1), a betaine-type, an alkylbetaine-type, or a sulfobetaine-type betaine compound may be used.

Examples of the betaine-type compound include coconut oil dimethylaminoacetic acid betaine (formula (1-1)), examples of the alkylbetaine-type compound include lauryl dimethylaminoacetic acid betaine (formula (1-2)), and examples of the sulfobetaine-type compound include lauramidopropyl hydroxysultaine (formula (1-3)):

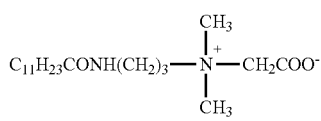

Formula (1-1)

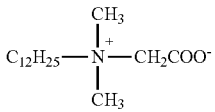

Formula (1-2)

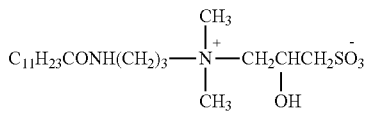

Formula (1-3)

The betaine-type compound is obtained by, for example, condensing a coconut oil fatty acid (for example, lauric acid) and dimethylaminopropylamine by heating, and reacting the resulting product with sodium chloroacetate.

The alkylbetaine-type compound is obtained by, for example, reacting a tertiary alkylamine (for example, lauryl dimethylamine) with sodium chloroacetate.

Of the amphoteric surfactants of formula (1), the sulfobetaine compound and the alkylbetaine-type compound are the most effective, compared with the betaine-type compound.

In formula (1) of the present invention, an amphoteric surfactant wherein $R^1$ is a $C_{10-20}$ alkyl group; $R^2$ and $R^3$ are each methyl group; and $X^-$ is a $C_{1-5}$ anion containing a carboxylate ion may be preferably used.

In the evaluation of a polished surface after polishing a wafer, the height difference between a central region and a peripheral region (laser mark region) of the wafer surface is about 100 nm when using the polishing composition containing the betaine-type compound, whereas the value can be reduced to 0 to 60 nm when using the polishing composition containing the sulfobetaine compound or alkylbetaine-type compound, which is more preferable.

In the polishing composition, the amphoteric surfactant of formula (1) is preferably used in the range of 1 to 10000 ppm, 100 to 5000 ppm, or 300 to 4000 ppm.

As the silica particles used in the present invention, silica particles in the form of an aqueous dispersion of silica particles having a mean primary particle diameter of 5 to 100 nm may be used. The aqueous dispersion of these silica particles is a silica sol. The silica in the silica sol corresponds to the silica particles in the polishing composition of the present invention. The aqueous medium in the silica sol can replace the water in the polishing composition. The water in the polishing composition originates from the water in the silica sol; however, other than this, water that is added as dilution water may be included.

The silica particles used in the present invention are colloidal silica having a mean primary particle diameter of 5 to 100 nm as determined by the nitrogen adsorption method. If the mean primary particle diameter is smaller than 5 nm, the polishing speed will be low, and moreover, the agglomeration of the silica particles is likely to occur, and thus, the stability of the polishing solution composition will be low. If the mean primary particle diameter is greater than 100 nm, a scratch is likely to form on the wafer surface, and the flatness of the polished surface will deteriorate.

When 0.5 μm or more coarse particles are contained in the silica sol in which the silica particles are dispersed in the aqueous medium, it is preferred to remove the coarse particles. The coarse particles may be removed using, for example, a forced sedimentation method or a microfiltration method. Examples of the filter used for microfiltration include a depth filter, a pleated filter, a membrane filter, and a hollow fiber filter, and any of the above can be used. Moreover, examples of materials of the filter include cotton, polypropylene, polystyrene, polysulfone, polyethersulfone, nylon, cellulose, and glass, and any of the above can be used. The filter rating of a filter is represented by the absolute filter rating (the size of the particles of which 99.9% or more are captured), and the silica particles are preferably treated with a filter having an absolute filter rating of 0.5 to 1.0 µm, from the viewpoint of production efficiency (treatment time, degree of clogging of the filter, and the like).

The content of the silica particles is preferably 0.05 to 50% by mass, preferably 0.1 to 20% by mass, and more preferably 5 to 10% by mass, based on the total mass of the polishing composition for a wafer. If the content of the silica particles is less than 0.05% by mass, sufficient polishing performance cannot be achieved, whereas if it is above 50% by mass, the stability of the polishing composition will deteriorate.

The alkali compound used in the present invention may be an alkali metal hydroxide, an ammonium salt, a quaternary ammonium hydroxide, an organic amine, or an alkali metal carbonate, for example.

Examples of the alkali metal hydroxide include lithium hydroxide, sodium hydroxide, and potassium hydroxide. In particular, sodium hydroxide or potassium hydroxide is preferred.

Examples of the alkali metal carbonate include lithium carbonate, sodium carbonate, potassium carbonate, lithium hydrogen carbonate, sodium hydrogen carbonate, and potassium hydrogen carbonate. In particular, sodium carbonate or potassium carbonate is preferred.

Examples of the ammonium salt include ammonium hydroxide, ammonium carbonate, and ammonium hydrogen carbonate. Among the above, ammonium hydroxide is preferred.

Examples of the quaternary ammonium salt include tetramethylammonium hydroxide, ethyltrimethylammonium hydroxide, diethyldimethylammonium hydroxide, triethylmethylammonium hydroxide, tetraethylammonium hydroxide, tetramethylammonium chloride, and tetraethylammonium chloride.

Examples of the organic amine include methylamine, dimethylamine, trimethylamine, ethylamine, diethylamine, triethylamine, monoethanolamine, diethanolamine, triethanolamine, N-methylethanolamine, N-methyl-N,N-diethanolamine, N,N-dimethylethanolamine, N,N-diethylethanolamine, N,N-dibutylethanolamine, ethylenediamine, hexaethylenediamine, ethylethylenediamine, piperazine hexahydrate, anhydrous piperazine, N-methylpiperazine, hydroxyethylpiperazine, N-aminoethylpiperazine, 1,3-propanediamine, N,N-dimethylethylenediamine, diethylenetriamine, monoisopropanolamine, diisopropanolamine, and triisopropanolamine. Among the above, monoethanolamine, ethylenediamine, or piperazine is preferred.

The preferred content of the alkali compound is 0.01 to 30% by mass based on the total mass of the polishing composition for a wafer of the present invention, although it may vary depending on the alkali compound to be used. When the alkali compound is an inorganic salt of an alkali metal, the content is preferably 0.01 to 1.0% by mass; when the alkali compound is a quarternary ammonium salt, the content is preferably 0.01 to 5.0% by mass; and when the alkali compound is an organic amine, the content is preferably 0.01 to 1.0% by mass. If the content of the alkali compound is less than 0.01% by mass, its function as a processing accelerator will not be sufficient; conversely, even if the content is above 30% by mass, further improvement in polishing performance cannot be expected. Two or more of the above-mentioned alkali compounds can be used in combination.

In the present invention, a chelate compound may be further added. Examples of the chelate compound include ethylenediamine tetraacetic acid salts, ethylenediamine disuccinic acid salts, nitrilotriacetic acid salts, diethylenetriamine pentaacetic acid salts, triethylenetetramine hexaacetic acid salts, and hydroxyethane phosphonic acid salts. The amount of the chelate compound to be added is 0.005 to 1.0% by mass based on the total mass of the polishing composition for a wafer of the present invention.

The wafer to which the polishing composition for a wafer of the present invention can be applied is a silicon wafer, a SiC wafer, a GaN wafer, a GaAs wafer, a GaP wafer, a glass wafer, an aluminum wafer, or a sapphire wafer, for example.

The polishing apparatus for polishing a wafer includes a single-sided polishing-type polishing apparatus and a double-sided polishing-type polishing apparatus, and the polishing solution composition for a wafer of the present invention can be used with any of the apparatuses.

By performing polishing using the polishing composition of the present invention, it is possible to produce, in the step of polishing a wafer, a wafer that gives a flat polished surface having a reduced height difference between the central region and the peripheral region (laser mark region) of the wafer.

EXAMPLES

Method for Evaluating Polishing Characteristics

Commercially available silicon wafers were polished by the following method.

1) Preparation of Polishing Compositions

Polishing compositions were produced by adding 20% by mass of colloidal silica (silica particles derived from a silica sol) having a mean primary particle diameter of 40 nm as determined by the nitrogen adsorption method, 1.0% by mass of ethyltrimethylammonium hydroxide (ETMAH, reagent) and 2.0% by mass of potassium carbonate ($K_2CO_3$) as basic compounds, 0.7% by mass of sodium ethylenediaminetetraacetate (reagent) as a chelating agent, and various additives in the proportions shown below, wherein the balance was water.

2) Polishing Dilute Solution

The polishing composition was diluted with water to a predetermined concentration and stirred for 10 minutes to give a polishing composition.

3) Polishing Conditions

Polishing machine: double-sided polishing machine 13BF manufactured by Hamai Co., Ltd.

Load: 150 g/cm$^2$

Upper lapping plate rotation speed: 7 rpm

Lower lapping plate rotation speed: 20 rpm

Polishing pad: polishing pad made of foamed polyurethane

Amount of the polishing dilute solution supplied: 6.0 L/minute

Polishing time: 30 minutes

Silicon wafer: diameter 200 mm, conductivity type P-type, crystal orientation <100>, and resistivity less than 100 Ω·cm 4) Cleaning Conditions After cleaning with water, cleaning was performed with a SC1 cleaning solution (cleaning solution having a 29% aqueous ammonia: 30% hydrogen peroxide solution:water weight ratio of 1:1:28) warmed to 40° C. to remove impurities on the wafer surface.

5) Method for Measuring Laser Mark Height

Using the stylus-type profiler P-16 manufactured by KLA-Tencor Corporation, a difference in height between the highest part and the lowest part of the wafer surface was measured on a roughness curve obtained by scanning a certain width (5 mm). When the value denoted as the "laser mark height" is 100 nm or less, the result is satisfactory, and when the value is 100 nm or more, the result is unsatisfactory.

Example 1

In the Preparation of Polishing Compositions above, the additive contained in the polishing composition was lauryl dimethylaminoacetic acid betaine (manufactured by NOF Corporation, trade name NISSANANON BL-SF, formula (1-2)), which was added in an amount of 630 ppm to the polishing composition. Water was added to give a polishing composition, and then a silicon wafer was polished using the polishing composition. The wafer was subsequently cleaned, and the laser mark height was measured. As a result, the laser mark height was less than 100 nm, that is, a satisfactory result was obtained.

Example 2

The same procedures as in Example 1 were performed except that in the Preparation of Polishing Compositions above, lauryl dimethylaminoacetic acid betaine (manufactured by NOF Corporation, trade name NISSANANON BL-SF, formula (1-2)) was added to give a content of 2100 ppm. As a result, the laser mark height was less than 100 nm, that is, a satisfactory result was obtained.

Example 3

The same procedures as in Example 1 were performed except that in the Preparation of Polishing Compositions above, coconut oil dimethylaminoacetic acid betaine (manufactured by NOF Corporation, trade name NISSANANON BF, formula (1-1)) was added to give a content of 630 ppm. As a result, the laser mark height was less than 100 nm, that is, a satisfactory result was obtained.

Example 4

The same procedures as in Example 1 were performed except that in the Preparation of Polishing Compositions above, coconut oil dimethylaminoacetic acid betaine (manufactured by NOF Corporation, trade name NISSANANON BF, formula (1-1)) was added to give a content of 2100 ppm. As a result, the laser mark height was less than 100 nm, that is, a satisfactory result was obtained.

Example 5

The same procedures as in Example 1 were performed except that in the Preparation of Polishing Compositions above, lauramidopropyl hydroxysultaine (manufactured by Kawaken Fine Chemicals Co., Ltd., trade name SOFTAZOLINE LSB, formula (1-3)) was added to give a content of 630 ppm. As a result, the laser mark height was less than 100 nm, that is, a satisfactory result was obtained.

Example 6

The same procedures as in Example 1 were performed except that in the Preparation of Polishing Compositions above, lauramidopropyl hydroxysultaine (manufactured by Kawaken Fine Chemicals Co., Ltd., trade name SOFTAZOLINE LSB, formula (1-3)) was added to give a content of 2100 ppm. As a result, the laser mark height was less than 100 nm, that is, a satisfactory result was obtained.

Comparative Example 1

In the Preparation of Polishing Compositions above, the additive contained in the polishing composition was tetrapropylammonium hydroxide (manufactured by Acros Organics Corporation, formula (2-1)), which was added in an amount of 630 ppm to the polishing composition. Water was added to give a polishing composition, and then a silicon wafer was polished using the polishing composition. The wafer was subsequently cleaned, and the laser mark height was measured. As a result, the laser mark height was 1000 nm, which was unsatisfactory.

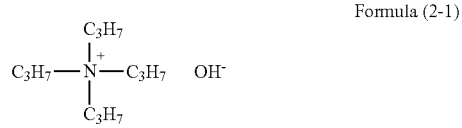

Formula (2-1)

Comparative Example 2

The same procedures as in Comparative Example 1 were performed except that tetrabutylammonium hydroxide (manufactured by Tokyo Ohka Kogyo Co., Ltd., formula (2-2)) was added to give a content of 630 ppm. As a result, the laser mark height was 270 nm, which was unsatisfactory.

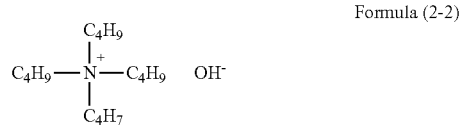

Formula (2-2)

Comparative Example 3

The same procedures as in Comparative Example 1 were performed except that N-lauroyl-N-methylglycine sodium salt (manufactured by NOF Corporation, trade name: FIRET L, formula (2-3)) was added to give a content of 630 ppm. As a result, the laser mark height was 380 nm, which was unsatisfactory.

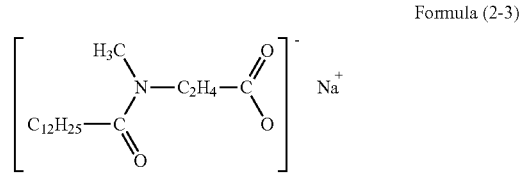

Formula (2-3)

Comparative Example 4

The same procedures as in Comparative Example 1 were performed except that fatty acid amide ether sulfate sodium salt (manufactured by NOF Corporation, trade name: SUNAMIDE CF-3, formula (2-4)) was added to give a content of 630 ppm. As a result, the laser mark height was 510 nm, which was unsatisfactory.

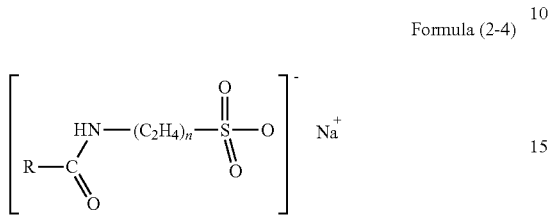

Formula (2-4)

Comparative Example 5

The same procedures as in Comparative Example 1 were performed except that coconut oil fatty acid diethanolamide (manufactured by DKS Co., Ltd, trade name: Dianol CDE, formula (2-5)) was added to give a content of 630 ppm. As a result, the laser mark height was 690 nm, which was unsatisfactory.

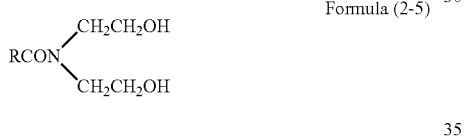

Formula (2-5)

Comparative Example 6

The same procedures as in Comparative Example 1 were performed except that 2-pyrrolidone (manufactured by Kanto Chemical Co., Inc., formula (2-6)) was added to give a content of 630 ppm. As a result, the laser mark height was 860 nm, which was unsatisfactory.

Formula (2-6)

Comparative Example 7

The same procedures as in Comparative Example 1 were performed except that pyroglutamic acid (manufactured by Acros Organics Corporation, formula (2-7)) was added to give a content of 630 ppm. As a result, the laser mark height was 130 nm, which was unsatisfactory.

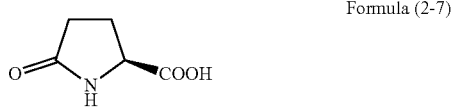

Formula (2-7)

Comparative Example 8

The same procedures as in Comparative Example 1 were performed except that glycerin (manufactured by NOF Corporation, trade name: GLYCERIN 85, formula (2-8)) was added to give a content of 630 ppm. As a result, the laser mark height was 260 nm, which was unsatisfactory.

Formula (2-8)

Comparative Example 9

The same procedures as in Comparative Example 1 were performed except that polyglycerin (manufactured by Sakamoto Yakuhin Kogyo Co., Ltd., trade name: POLYGLYCERIN #310, formula (2-9)) was added to give a content of 630 ppm. As a result, the laser mark height was 460 nm, which was unsatisfactory.

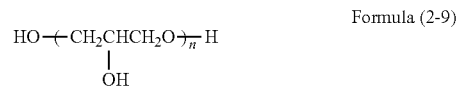

Formula (2-9)

Comparative Example 10

The same procedures as in Comparative Example 1 were performed except that polyoxyethylene polyglyceryl ether (manufactured by Sakamoto Yakuhin Kogyo Co., Ltd., trade name: SC-E1500, formula (2-10)) was added to give a content of 630 ppm. As a result, the laser mark height was 270 nm, which was unsatisfactory.

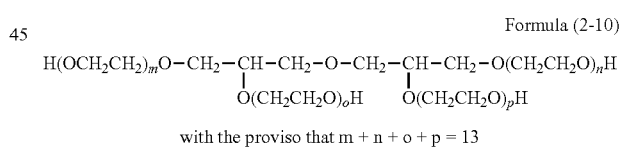

Formula (2-10)

with the proviso that m + n + o + p = 13

INDUSTRIAL APPLICABILITY

By performing polishing using the polishing composition of the present invention, it is possible to produce, in the step of polishing a wafer, a wafer that gives a flat polished surface having a reduced height difference between a central region and a peripheral region (laser mark region) of the wafer.

The invention claimed is:
1. A polishing composition comprising:
water, silica particles, an alkaline substance, and an amphoteric surfactant selected from the group consisting of formula (1-1), formula (1-2) and formula (1-3):

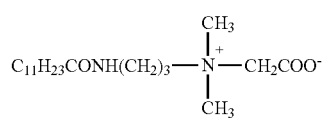

Formula (1-1)

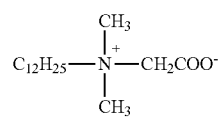

Formula (1-2)

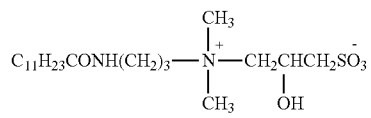

Formula (1-3)

the polishing composition contains 0.05 to 50% by mass of the silica particles, 0.01 to 30% by mass of the alkaline substance, and 1 to 10000 ppm of the amphoteric surfactant, and the balance is water, and the polishing composition is used in a wafer polishing step, and is for polishing until a height difference between a central region and a peripheral region of the wafer becomes 100 nm or less.

2. The polishing composition according to claim 1, wherein the silica particles are silica particles in a form of an aqueous dispersion of silica particles having a mean primary particle diameter of 5 to 100 nm.

3. The polishing composition according to claim 1, wherein the alkaline substance is an alkali metal hydroxide, an ammonium salt, a quaternary ammonium hydroxide, an organic amine, or an alkali metal carbonate.

4. The polishing composition according to claim 1, further comprising a chelating agent.

5. The polishing composition according to claim 1, wherein the polishing composition contains 300 to 4000 ppm of the amphoteric surfactant.

6. The polishing composition according to claim 1, wherein the alkaline substance is an alkali metal hydroxide.

7. The polishing composition according to claim 1, wherein the alkaline substance is an ammonium salt.

8. The polishing composition according to claim 1, wherein the alkaline substance is a quaternary ammonium hydroxide.

9. The polishing composition according to claim 1, wherein the alkaline substance is an alkali metal carbonate.

10. The polishing composition according to claim 1, wherein the amphoteric surfactant has the structure of the formula (1-1).

11. The polishing composition according to claim 1, wherein the amphoteric surfactant has the structure of the formula (1-2).

12. The polishing composition according to claim 1, wherein the amphoteric surfactant has the structure of the formula (1-3).

13. A method for producing a wafer comprising the step of polishing a wafer using the polishing composition according to claim 1.

14. The method for producing a wafer according to claim 13, wherein in the step of polishing a wafer, polishing is performed until a height difference between a central region and a peripheral region of the wafer becomes 100 nm or less.

* * * * *